United States Patent [19]

Hudson, Jr.

[11] Patent Number: 4,894,800
[45] Date of Patent: Jan. 16, 1990

[54] RECONFIGURABLE REGISTER BIT-SLICE FOR SELF-TEST

[75] Inventor: Charles L. Hudson, Jr., Plymouth, Minn.

[73] Assignee: Honeywell, Inc., Minneapolis, Minn.

[21] Appl. No.: 248,888

[22] Filed: Sep. 23, 1988

[51] Int. Cl.⁴ ............................................. G11C 13/00
[52] U.S. Cl. ................................... 371/22.5; 365/201; 365/189.04; 365/189.08; 365/78
[58] Field of Search ............ 365/78, 154, 201, 189.01, 365/189.04, 189.05, 189.08, 230.01, 230.03; 371/21

[56] References Cited

U.S. PATENT DOCUMENTS 4,503,537  3/1985  McAnney .
4,513,418  4/1985  Bardell, Jr. et al. .
4,594,711  6/1986  Thatte .
4,597,080  6/1986  Thatte et al. .
4,622,647  11/1986  Sagnard et al. .

FOREIGN PATENT DOCUMENTS

WO8703098  11/1986  World Int. Prop. O. .

OTHER PUBLICATIONS

Konemann et al., Build-In Logic Block Observation Techniques, 1979 *IEEE H Test Conference, Cherry Hill, N.J., pp. 37–41.*
McCluskey, Edward J., Built-In Self-Test Structures, *IEEE*Design and Test of Computers, vol. 2, No. 2, Apr. 1985, pp. 29–36.

*Primary Examiner*—Terrell W. Fears
*Attorney, Agent, or Firm*—W. T. Udseth

[57] ABSTRACT

A re-configurable register bit-slice is disclosed for use in built-in logic block observers (i.e. BILBOs). The register bit-slice may be configured to a plurality of operational modes. Front-end logic is disclosed which switches a single current switch (e.g. transistor) between a data input and an output of the front-end logic. Thus, a single current switch of delay is added to normal operation of a standard shift register modified to be reconfigurable.

16 Claims, 3 Drawing Sheets

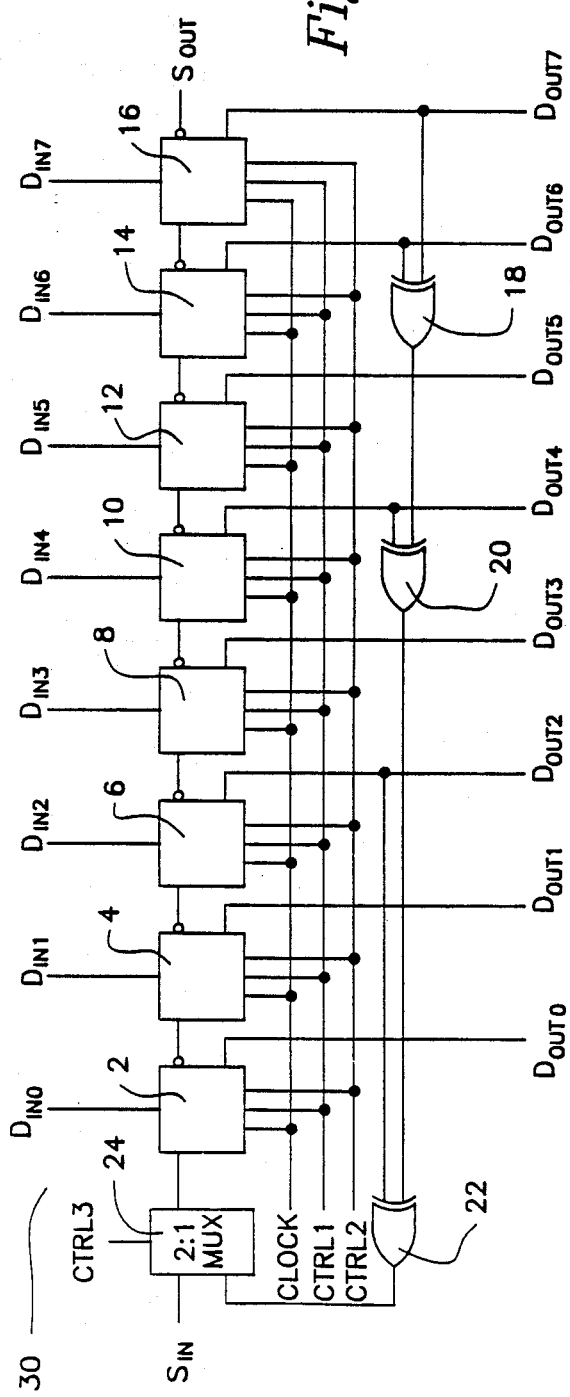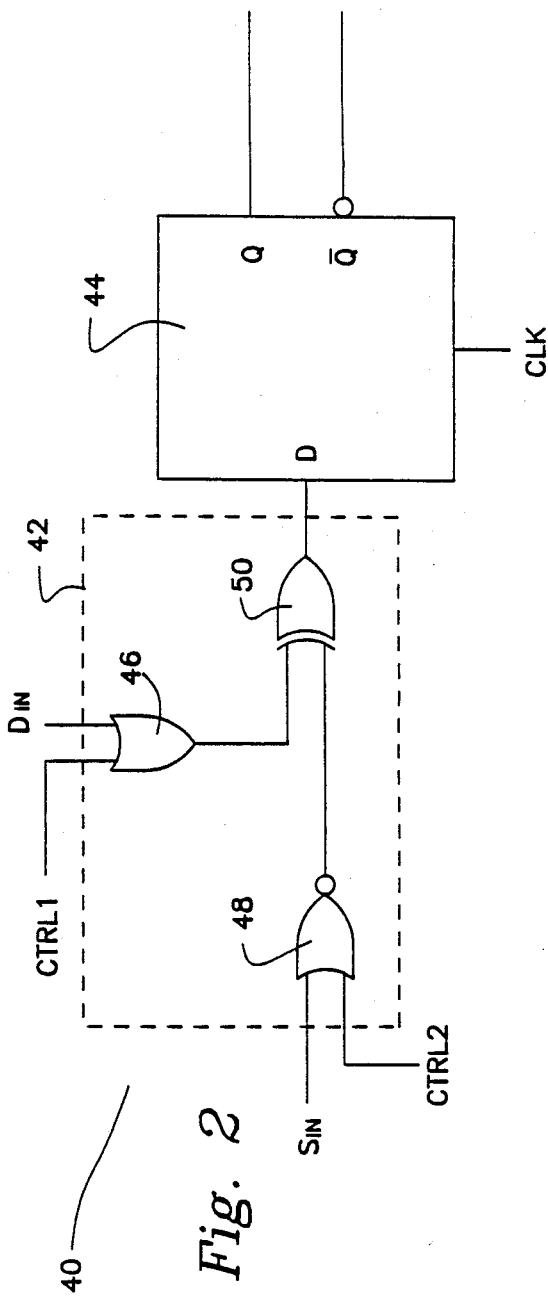
Fig. 1
Fig. 2

RECONFIGURABLE REGISTER BIT-SLICE FOR SELF-TEST

The U.S. Government has rights in this invention pursuant to Contract No. F33615-84-C-1500 awarded by the U.S. Air Force.

BACKGROUND OF THE INVENTION

The present invention relates to testing of complex logic circuits and, more particularly, to reconfigurable register bit-slices for use in built-in logic block observers (i.e. BILBOs).

Traditionally, large scale integrated circuits have needed to be tested for defects or flaws. When only a fraction of the total components produced by a manufacturing process are "good" (i.e., meet the requirements of specifications), something must separate the "good" components from components which contain defects or flaws. Testing does this by applying input stimulus (input test patterns) to the device-under-test and comparing the outputs of the device-under-test with the expected "good" results.

In the past, test pattern generation has been done by hand or with a limited amount of aid from a computer. As the designs of the circuits being tested become increasingly complex, the test time required to generate test patterns by hand increases significantly.

An alternative to expensive manual test pattern generation exists. Designers can incorporate a number of simple design techniques into their circuit design which will reduce the cost of test pattern generation and application while actually allowing better test quality. In addition, it is possible to build into the circuit to be tested a number of capabilities typically required of external test equipment. These built-in self-test (BIST) techniques can greatly simplify automatic test equipment requirements and can result in significant costs savings.

Although testability-improvement techniques and built-in self-test techniques are attractive from the perspective of test cost reduction, they carry with them some significant costs which must be evaluated. Most design-for-test techniques consume chip real estate, power, I/O pins and may impact the speed performance of the circuit during normal operation.

Designs which use built-in self-test provide for generation of input stimulus and evaluation of the circuit response within the actual circuit design. To minimize the on-chip circuitry, external sequencing of the self-test operation is often used. A variety of methods exist for both providing the input stimulus and evaluating the circuit response. One such method is built-in self-test with pseudo-random test patterns.

The addition of a test pattern generator, a parallel signature analysis register, and a serial-scan register to a logic circuit for testing purposes consumes chip real estate and power. A solution to the problem of adding a plurality of test components to a logic circuit exists which combines the needed functions into a single register. This register is known as a built-in logic block observer (i.e. BILBO).

In order to support the various modes of operation, each BILBO register bit-slice requires front-end logic which reconfigures the register to a synchronized set, a serial-scan a test pattern generator, a signature analysis or a normal (i.e. parallel load) operational mode. Control inputs of the front-end logic are used to determine the operational mode of the BILBO.

BILBO registers can be strategically placed throughout a logic circuit to provide means for testing sections of the logic circuit. In a typical scenario, a first BILBO register is configured as a test pattern generator and a second BILBO register is configured as a signature analysis register. The test pattern generator applies a sequence of patterns to a section of a logic circuit while the results of the pattern sequence are compacted by the signature analysis register. When the test pattern sequence is complete, the second BILBO register is reconfigured as a serial-scan register and the compacted results are transferred to another location.

Current designs of BILBO registers comprise a plurality of bit-slices logically coupled together. The bit-slices comprise front-end logic which must switch more than one current switch along a signal path from a data input to an input of a memory device (e.g. bi-stable multi-vibrator) while operating in normal mode (i.e. parallel load). This switching causes a register in normal operational mode to perform at a slower rate than real-time speed. Real-time speed, in this instance, is considered the rate at which a register without front-end logic operates during the normal operational mode. It is desirable to utilize front-end logic which has minimal speed impact upon normal register operation.

The present invention overcomes the problem of real-time speed operation during normal operation inherent in previous BILBO register designs. Through clever logic design techniques, the present invention provides front-end logic for a BILBO register bit-slice which switches one current switch along a signal path from a data input to an input of a memory device (e.g. bi-stable multi-vibrator). The delay caused by the switching of a one current switch is equivalent to the delay associated with a 2:1 multiplexer or approximately one gate of delay. Thus, near real-time speed is obtained during the normal operational mode because a single current switch occurs along the signal path.

SUMMARY OF THE INVENTION

A reconfigurable register bit-slice is provided for use in a BILBO register. More particularly, front-end logic means is contemplated which switches a single current switch (e.g. transistor) between a data input means and an output of the front-end logic means. Thus a single current switch of delay is added to normal operation of a standard shift register modified to be reconfigurable.

BRIEF DESCRIPTION OF THE DRAWINGS

FIG. 1 is a logic level diagram showing a BILBO register utilizing preferred embodiment bit-slices.

FIG. 2 is a logic level diagram showing a preferred embodiment bit-slice.

DETAILED DESCRIPTION OF THE PREFERRED EMBODIMENTS

Figure 3:
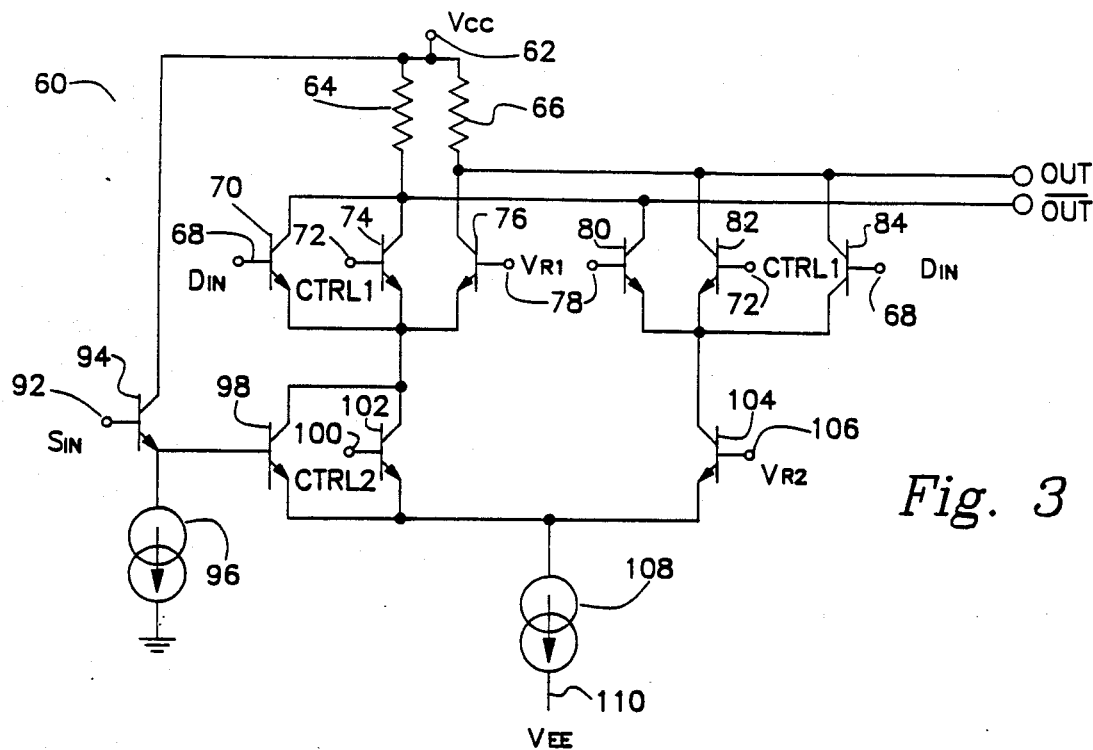
FIG. 3 is a transistor level diagram showing a preferred embodiment front-end logic means utilizing CML design structures.

Shown in FIG. 1 is a preferred embodiment BILBO register 30 comprising serially coupled register bit-slices 2,4,6,8,10,12,14 and 16. The inverted output of a previous bit-slice is logically coupled to the second data input of the following bit-slice. For instance, the inverted output of bit-slice 2 is logically coupled to the serial data inpout of bit-slice 4. Each bit-slice further comprises a first data input, a clock input, an input CTRL1, an input CTRL2 and a second data output. BILBO register 30 operates in various modes in operation in accordance with the signals present at CTRL1 input and CTRL2 input. BILBO register 30 further comprises test pattern generation/serial scan circuitry 18,20,22 and 24 logically coupled to the register bit-slices in a manner which enables a serial scan operational mode or a self-test operational mode depending upon the signal present at input CTRL3.

FIG. 2 shows a logic level description of a bit-slice used in the preferred embodiments. The forthcoming logic level description utilizes positive logic designs. It will be appreciated by those skilled in the art that a negative logic level description could also be implemented as an embodiment of the present invention. Bit-slice 40 can be inserted into bit-slice blocks 2,4,6,8,10,12,14 and 16 in FIG. 1 to provide a full logic level description of BILBO register 30.

Bit-slice 40 comprises front-end logic means 42 logically coupled to an input of memory means 44. Memory means 44 preferably comprises means for storing a binary data bit (e.g., a bi-stable multi-vibrator or a flip-flop), an output and a clock input. Front-end logic means 42 further preferably comprises a first data input means, a second data input means, control input means and logic means. In the preferred embodiments shown, the logic means comprises OR gate 46 and NOR gate 48 logically coupled to the inputs of XOR gate 50, and the inputs of OR gate 46 are logically coupled to the input CTRL1 and the first data input (i.e. $D_{IN}$). The inputs of NOR gate 48 are preferably logically coupled to input CTRL2 and the second data input (i.e. $S_{IN}$).

Front-end logic means 42 implements a logical function of the first data input (i.e. $D_{IN}$), the second data input (i.e. $S_{IN}$), input CTRL1 and input CTRL2. In the preferred embodiment, bit-slice 40 configures to a plurality of operational modes in accordance with the output of the logical function provided to the input for memory means 44. The logical function implemented is preferably:

$$(D_{IN} + CTRL1) \text{ XOR } \overline{(S_{IN} + CTRL2)}$$

In the preferred embodiment, the output of this function is provided to the input of memory means 44. The following table details the preferred output of the front-end logic provided to the input of memory means 44.

TABLE

| Mode | CTRL1 | CTRL2 | Output of Front-End Logic |
|------|-------|-------|---------------------------|
| 1 | 0 | 0 | $D_{IN} \text{XOR} \overline{S_{IN}}$ |
| 2 | 0 | 1 | $D_{IN}$ |
| 3 | 1 | 0 | $S_{IN}$ |
| 4 | 1 | 1 | 1 |

Bit-slice 40, operating in the first operational mode, preferably provides the output of $[D_{IN} \overline{\text{XOR}} S_{IN}]$ to the input of memory means 44. When operating in the second operational mode, bit-slice 40 preferably provides the logic signal received by $D_{IN}$ to the input of memory means 44. Further, when operating in the third operational mode, bit-slice 40 preferably provides the logic signal received by $S_{IN}$ to the input of memory means 44. Finally, memory means 44 preferably receives a logical "true" signal when operating in the fourth operational mode. It will be appreciated by those skilled in the art that a complement of the front-end logic output could be provided to the input of memory means 44. Further, it will be appreciated by those skilled in the art that other logic functions could be implemented by the front-end logic to provide other operational modes.

FIG. 3 shows a preferred transistor level description 60 of the front-end logic 42 of bit-slice 40 shown in FIG. 2. Front-end logic means 60 utilizes current-mode-logic (CML) design structures. Thus, typically, $V_{CC}$ 62 is set to +3.3V and $V_{EE}$ 110 is set to OV. Further, $V_{R1}$ 78 is approximately equal to $V_{CC}$ 62 $-\frac{1}{2}V_{BE}$(on) $-0.7V$ and $V_{R2}$ 106 is approximately equal to $V_{R1}$ 78 $-V_{BE}$(on).

When CRTL1 72 and CTRL2 100 are set to a logical "low" signal, front-end logic 60 operates in the first operational mode. Thus, transistors 74, 82 and 102 are switched off and a logical function of the signals received by $D_{IN}$ 68 and $S_{IN}$ 92 is provided to outputs and 90. In the preferred embodiment, the logical function is $[D_{IN} \text{ XOR } \overline{S_{IN}}]$.

If the logic signal received by $D_{IN}$ 68 is a logical "low" signal with respect to $V_{R1}$ 78, then transistors 70 and 84 will be switched off and a current conduction path is provided through transistor 76 or 80. Further, if the logic signal received by $S_{IN}$ 92 is a logical "low" signal with respect to $V_{R2}$ 106 after having its voltage level shifted by transistor 94 and current source 96, then transistor 98 will be switched off and a current conduction path will be provided through transistor 104. Thus, the current path from $V_{CC}$ 62 to $V_{EE}$ 110 will be through resistor 64, transistor 80, transistor 104 and current source 108. This current path causes a voltage drop across resistor 64 which results in a logical "low" signal being provided to output 90. Because all of the current from current source 108 passes through resistor 64, no voltage drop occurs across resistor 66 which results in a logical "high" signal being provided to output 88.

Otherwise, if the logic signal received by $S_{IN}$ 92 is a logical "high" with respect to $V_{R2}$ 106 after having its voltage level shifted by transistor 94 and current source 96, then transistor 104 will be switched off and a current conduction path will be provided through transistor 98. Thus, the current path from $V_{CC}$ 62 to $V_{EE}$ 110 will be through resistor 66, transistor 76, transistor 98 and current source 108. This current path causes a voltage drop across resistor 66 which results in a logical "low" signal being provided to output 88. Because all of the current from current source 108 passes through resistor 66, no voltage drop occurs across resistor 64, which results in a logical "high" signal being provided to output 90.

If the logic signal received by $D_{IN}$ 68 is a logical "high" signal with respect to $V_{R1}$ 78, then transistors 76 and 80 will be switched off and a current conduction path will be provided through transistor 70 or 84. Further, if the signal received by $S_{IN}$ 92 is a logical "low" signal with respect to $V_{R2}$ 106after having its voltage level shifted by transistor 94 and current source 96, then transistor 98 will be switched off and a current conduction path will be provided through transistor 104. Thus, the current conduction path causes a voltage drop across resistor 66, which results in a logical "low" signal being provided to output 88. Because all of the current from current source 108 passes through resistor 66, no voltage drop occurs across resistor 64, which results in a logical "high" signal being provided to output 90.

If the logic signal received by $S_{IN}$ 92 is a logical "high" with respect to $V_{R2}$ 106 after having its voltage level shifted by transistor 94 and current source 96, then transistor 104 will be switched off and a current conduction path will be provided through transistor 98. Thus, the current path from $V_{CC}$ 62 to $V_{EE}$ 110 will be through resistor 64, transistor 70, transistor 98 and current source 108. This current path causes a voltage drop across resistor 64 which results in a logical "low" signal being provided to output 90. Because all of the current from current source 108 passes through resistor 64, no voltage drop occurs across resistor 66, which results in a logical "high" signal being provided to output 88.

When CTRL1 72 is set to a logical "low" signal and CTRL2 100 is set to a logical "high" signal, front-end logic 60 operates in the second operational mode. Thus, transistor 74 and 82 are switched off and a current conduction path is provided through transistor 102. As a result, the logic signal received at $S_{IN}$ 92 does not change the current conduction path because the current is already flowing through the coupled pair of transistors 98 and 102 and will continue to do so regardless of the logic signal present at $S_{IN}$ 92. Therefore, a logical function of the signal received by $D_{IN}$ 68 is provided to outputs 88 and 90. This logical function is generated by switching a single transistor (i.e. transistor 70 or 76) along the current conduction path. Thus, a single transistor (i.e. current switch) switches along the logical signal path from $D_{IN}$ 68 to output 88 or 90 during the second operational mode.

If the logic signal received by $D_{IN}$ 68 is a logical "low" signal with respect to $V_{R1}$ 78, then transistors 70 and 84 will be switched off and a current conduction path will be provided through transistors 76 and 80. Thus, the current conduction path from $V_{CC}$ 62 to $V_{EE}$ 110 will be through resistor 66, transistor 76, transistor 102 and current source 108. This current path causes a voltage drop across resistor 66 which results in a logical "low" signal being provided to output 88. Because all of the current from current source 108 passes through resistor 66, no voltage drop occurs across resistor 64, which results in a logical "high" signal being provided to output 90.

Otherwise, if the logic signal received by $D_{IN}$ 68 is a logical "high" signal with respect to $V_{R1}$ 78, then transistors 76 and 80 will be switched off and a current conduction path will be provided through transistors 70 and 84. Thus, the current conduction path from $V_{CC}$ 62 to $V_{EE}$ 110 will be through resistor 64, transistor 70, transistor 102 and current source 108. This current path causes a voltage drop across resistor 64, which results in a logical "low" signal being provided to output 90. Because all of the current from current source 108 passes through resistor 64, no voltage drop occurs resistor 66, which results in a logical "high" signal being provided to output 88.

When CTRL1 72 is set to a logical "high" signal and CTRL2 100 is set to a logical "low" signal, front-end logic 60 operates in the third operational mode. Thus, transistor 102 is switched off, and a current conduction path is provided through transistor 74 or 82. As a result, the logic signal received at $D_{IN}$ 68 does not change the current conduction path because the current is already flowing through the coupled pairs of transistors 70 and 74 as well as 82 and 84 and will continue to do so regardless of the logical signal present at $D_{IN}$ 68. Therefore, a logical function of $S_{IN}$ 92 is provided to outputs 88 and 90.

If the logic signal received by $S_{IN}$ 92 is a logical "low" signal with respect to $V_{R2}$ 106 after having its voltage level shifted by transistor 94 and current source 96, then transistor 98 will be switched off, and a current conduction path will be provided through transistor 104. Thus, the current conduction path from $V_{CC}$ 62 to $V_{EE}$ 110 will be through resistor 66, transistor 82, transistor 104 and current source 108. This current path causes a voltage drop across resistor 66 which results in a logical "low" signal being provided to output 88. Because all of the current from current source 108 passes through resistor 66, no voltage drop occurs across resistor 64, which results in a logical "high" signal being provided to output 90.

Otherwise, if the logic signal received by $S_{IN}$ 92 is a logical "high" signal with respect to $V_{R2}$ 106 after having its voltage level shifted by transistor 94 and current source 96, then transistor 104 will be switched off, and a current conduction path will be provided through transistor 98. Thus, the current conduction path from $V_{CC}$ 62 to $V_{EE}$ 110 will be through resistor 64, transistor 74, transistor 98 and a current source 108. This current path causes a voltage drop across resistor 64, which results in a logical "low" signal being provided to output 90. Because all of the current from current source 108 passes through resistor 64, no voltage drop occurs across resistor 66, which results in a logical "high" signal being provided to output 88.

When CTRL1 62 and CTRL 100 are set to a logical "high", front-end logic 60 operates in the fourth operational mode. Thus, a current conduction path is provided through either transistor 74 or 82 as well as transistor 102. Therefore, the current conduction path from $V_{CC}$ 62 to $V_{EE}$ 110 will be through resistor 64, transistor 74, transistor 102 and current source 108. This current path causes a voltage drop across resistor 64, which results in a logical "low" signal being provided to output 90. Because all of the current from current source 108 passes through resistor 64, no voltage drop occurs across resistor 66, which results in a logical "high" signal being provided to output 88.

Figure 4:
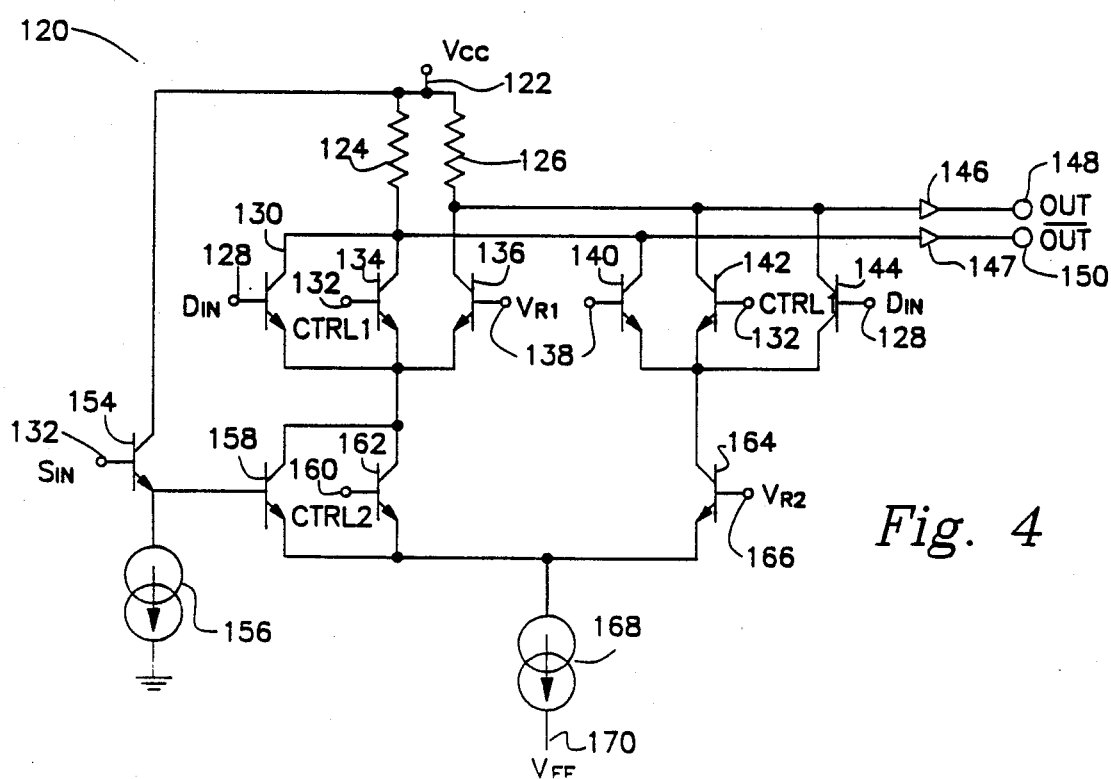
FIG. 4 is a transistor level diagram showing a preferred embodiment front-end logic means and logic level adjust means utilizing ECL design structures.

FIG. 4 shows an alternate preferred transistor level description 120 of front-end logic 42 of bit-slice 40 shown in FIG. 2. Front-end logic means 120 utilizes emitter-coupled-logic (ECL) design structures. Thus, typically $V_{CC}$ 122 is set to 0 V, and $V_{EE}$ 170 is set to the negative supply voltage. Further, $V_{R1}$ 138 is approximately equal to $V_{CC}$ 122 $-\frac{1}{2}V_{BE}(on)-0.7V$ and $V_{R2}$ 166 is approximately equal to $V_{R1}$ 138 $-V_{BE}(on)$.

When CTRL1 132 and CTRL2 160 are set to a logical "low" signal, front-end logic 120 operates in the first operational mode. Thus, transistors 134, 142 and 162 are switched off, and a logical function of the logic signals received by $D_{IN}$ 128 and $S_{IN}$ 152 is provided to outputs 148 and 150 through logic signal level adjust means 146 and 147, respectively. Logic signal level adjust means 146 and 147 adjust the outputs provided by the ECL front-end logic 120 to logic levels acceptable to the input of the memory means. In the preferred embodiment, the logical function is [$D_{IN}$ XOR $\overline{S_{IN}}$].

If the logic signal received by $D_{IN}$ 128 is a logical "low" signal with respect to $V_{R1}$ 138, then transistors 130 and 144 will be switched off, and a current conduction path is provided through transistor 136 or 140. Further, if the logic signal received by $S_{IN}$ 152 is a logical "low" signal with respect to $V_{R2}$ 166 after having its voltage level shifted by transistor 154 and current source 156, then transistor 158 will be switched off, and a current conduction path will be provided through transistor 164. Thus, the current path from $V_{CC}$ 122 to $V_{EE}$ 170 will be through resistor 124, transistor 140, transistor 164 and current source 168. This current path causes a voltage drop across resistor 124, which results in a logical "low" signal being provided to output 150 through logic level adjust means 147. Because all of the current form current source 168 passes through resistor 124, no voltage drop occurs across resistor 126, which results in a logical "high" signal being provided to output 148 through logic level adjust means 146.

Otherwise, if the logic signal received by $S_{IN}$ 152 is a logical "high" with respect to $V_{R2}$ 166 after having its voltage level shifted by transistor 154 and current source 156, then transistor 164 will be switched off, and a current conduction path will be provided through transistor 158. Thus, the current path from $V_{CC}$ 122 to $V_{EE}$ 170 will be through resistor 126, transistor 136, transistor 158 and current source 168. This current path causes a voltage drop across resistor 126, which results in a logical "low" signal being provided to output 148 through logic level adjust means 146. Because all of the current from current source 168 passes through resistor 126, no voltage drop occurs across resistor 124, which results in a logical "high" signal being provided to output 150 through logic level adjust means 147.

If the logic signal received by $D_{IN}$ 128 is a logical "high" signal with respect to $V_{R1}$ 138, then transistors 136 and 140 will be switched off, and a current conduction path will be provided through transistor 130 or 144. Further, if the signal received by $S_{IN}$ 152 is a logical "low" signal with respect to $V_{R2}$ 166 after having its voltage level shifted by transistor 154 and current source 156, then transistor 158 will be switched off, and a current conduction path will be provided through transistor 164. Thus, the current conduction path causes a voltage drop across resistor 126, which results in a logical "low" signal being provided to output 148 through logic level adjust means 146. Because all of the current from current source 168 passes through resistor 126, no voltage drop occurs across resistor 124, which results in a logical "high" signal being provided to output 150 through logic level adjust means 147.

If the logic signal received by $S_{IN}$ 152 is a logical "high" with respect to $V_{R2}$ 166 after having its voltage level shifted by transistor 154 and current source 156, then transistor 164 will be switched off, and a current conduction path will be provided through transistor 158. Thus, the current path from $V_{CC}$ 122 to $V_{EE}$ 170 will be through resistor 124, transistor 130, transistor 158 and current source 168. This current path causes a voltage drop across resistor 124, which results in a logical "low" signal being provided to output 150 through logic level adjust means 147. Because all of the current from current source 168 passes through resistor 124, no voltage drop occurs across resistor 126, which results in a logical "high" signal being provided to output 148 through logic level adjust means 146.

When CTRL1 132 is set to a logical "low" signal and CTRL2 160 is set to a logical "high" signal, front-end logic 120 operates in the second operational mode. Thus, transistor 134 and 142 are switched off, and a current conduction path is provided through transistor 162. As a result, the logic signal received at $S_{IN}$ 152 does not change the current conduction path because the current is already flowing through the coupled pair of transistors 158 and 162 and will continue to do so regardless of the logic signal present at $S_{IN}$ 152. Therefore, a logical function of the logic signal received by $D_{IN}$ 128 is provided to outputs 148 and 150 through logic signal level adjust means 146 and 147, respectively. This logical function is generated by switching a single transistor (i.e. transistor 130 or 136) along the current conduction path. Thus, a single transistor (i.e., current switch) switches along the logical signal path from $D_{IN}$ 128 to logic level adjust means 146 or 147 during the second operational mode.

If the logic signal received by $D_{IN}$ 128 is a logical "low" signal with respect to $V_{R1}$ 138, then transistor 130 or 144 will be switched off, and a current conduction path will provided through transistors 136 and 140. Thus, the current conduction path from $V_{CC}$ 122 to $V_{EE}$ 170 will be through resistor 126, transistor 136, transistor 162 and current source 168. This current path causes a voltage drop across resistor 126, which results in a logical "low" signal being provided to output 148 through logic level adjust means 146. Because all of the current from current source 168 passes through resistor 126, no voltage drop occurs across resistor 124, which results in a logical "high" signal being provided to output 150 through logic level adjust means 147.

Otherwise, if the logic signal received by $D_{IN}$ 128 is a logical "high" signal with respect to $V_{R1}$ 138, then transistors 136 and 140 will be switched off, and a current conduction path will be provided through transistors 130 and 144. Thus, the current conduction path from $V_{CC}$ 122 to $V_{EE}$ 170 will be through resistor 124, transistor 130, transistor 162 and current source 168. This current path causes a voltage drop across resistor 124, which results in a logical "low" signal being provided to output 150 through logic level adjust means 147. Because all of the current from current source 168 passes through resistor 124, no voltage drop occurs across resistor 126, which results in a logical "high" signal being provided to output 148 through logic level adjust means 146.

When CTRL1 132 is set to a logical "high" signal and CTRL2 160 is set to a logical "low" signal, front-end logic 120 operates in the third operational mode. Thus, transistor 162 is switched off, and a current conduction path is provided through transistor 134 or 142. As a result, the logic signal received at $D_{IN}$ 128 does not change the current conduction path because the current is already flowing through the coupled pairs of transistors 132 and 134 as well as 142 and 144 and will continue to do so regardless of the logical signal present at $D_{IN}$ 128. Therefore, a logical function of $S_{IN}$ 152 is provided to outputs 148 and 150 through logic signal level adjust means 146 and 147, respectively.

If the logic signal received by $S_{IN}$ 152 is a logical "low" signal with respect to $V_{R2}$ 166 after having its voltage level shifted by transistor 154 and current source 156, then transistor 158 will be switched off, and a current conduction path will be provided through transistor 164. Thus, the current conduction path from $V_{CC}$ 122 to $V_{EE}$ 170 will be through resistor 126, transistor 142, transistor 164 and current source 168. This current path causes a voltage drop across resistor 126, which results in a logical "low" signal being provided to output 148 through logic level adjust means 146.

Because all of the current from current source 168 passes through resistor 126, no voltage drop occurs across resistor 124, which results in a logical "high" signal being provided to output 150 through logic level adjust means 147.

Otherwise, if the logic signal received by $S_{IN}$ 152 is a logical "high" signal with respect to $V_{R2}$ 166 after having its voltage level shifted by transistor 154 and current source 156, then transistor 164 will be switched off, and a current conduction path will be provided through transistor 158. Thus, the current conduction path from $V_{CC}$ 122 to $V_{EE}$ 170 will be through resistor 124, transistor 134, transistor 158 and current source 168. This current path causes a voltage drop across resistor 124 which results in a logical "low" signal being provided to output 150 through logic level adjust means 147. Because all of the current from current source 168 passes through resistor 124, no voltage drop occurs across resistor 126, which results in a logical "high" signal being provided to output 148 through logic level adjust means 146.

When CTRL1 132 and CTRL 160 are set to a logical "high", front-end logic 120 operates in the fourth operational mode. Thus, a current conduction path is provided through either transistor 134 or 142 as well as transistor 162. Therefore, the current conduction path from $V_{CC}$ 122 to $V_{EE}$ 170 will be through resistor 124, transistor 134, transistor 162 and current source 168. This current path causes a voltage drop across resistor 124, which results in a logical "low" signal being provided to output 150 through logic level adjust means 147. Because all of the current from current source 168 passes through resistor 124, no voltage drop occurs across resistor 126, which results in a logical "high" a signal being provided to output 148 logic level adjust means 146.

Figure 5:
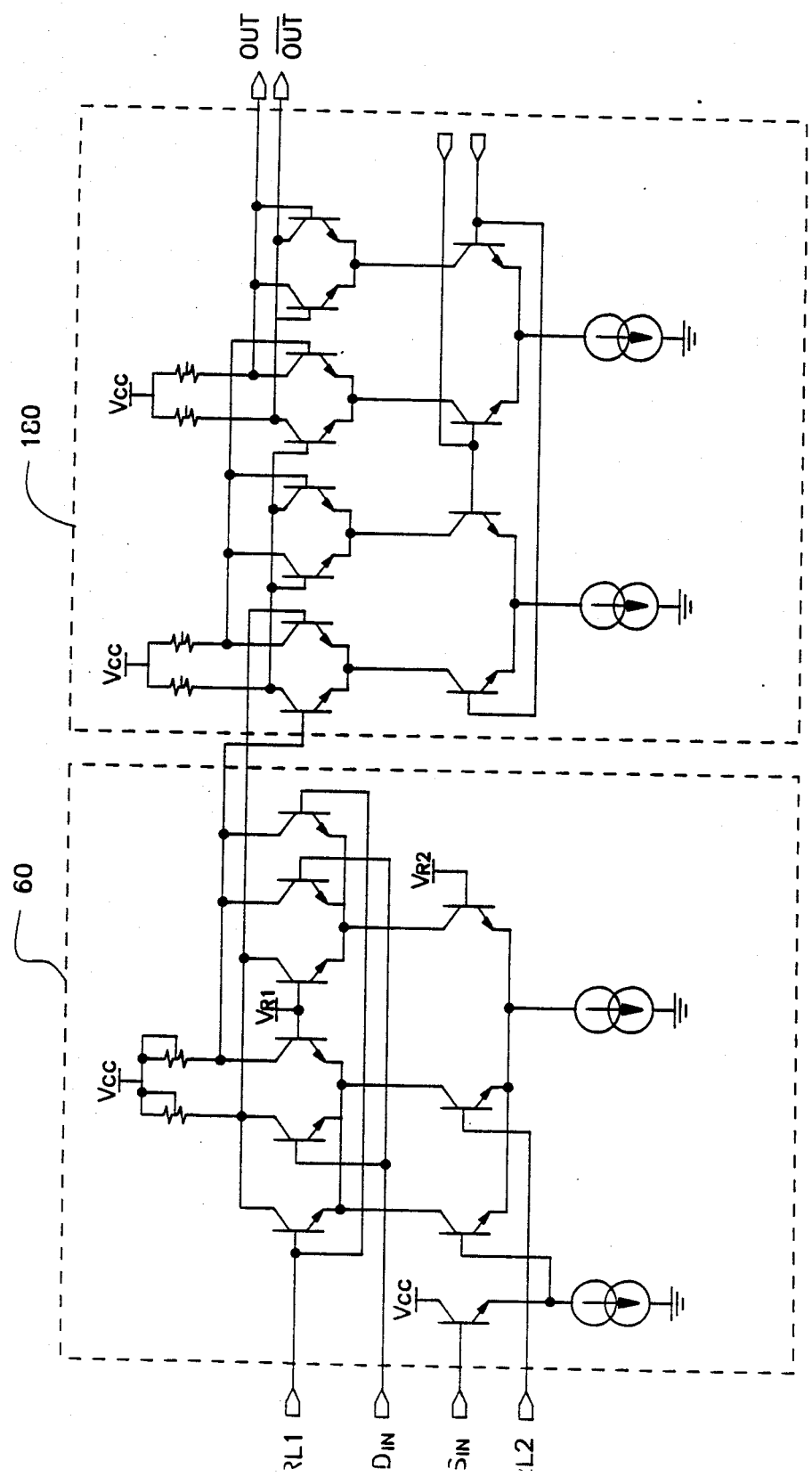
FIG. 5 is a transistor level diagram showing a preferred embodiment bit-slice utilizing CML design structures.

FIG. 5 shows a further preferred embodiment transistor level description 180 of bit-slice 40 shown in FIG. 2. Front-end logic 60 corresponds to front-end logic 42 of FIG. 2. Further, memory means 180 corresponds to memory means 44 of FIG. 2. Memory means 180 is a master-slave flip-flop implemented utilizing CML design structures.

It will be readily apparent to those skilled in the art that many modifications to the preferred embodiments of the present invention are possible without deviating from the scope and spirit of the present invention. Special conditions employed for the implementation of the preferred embodiments are not intended to be limiting, and are easily adaptable to alternate implementations.

Although specific logic configurations and electrical configurations have been illustrated and described for the preferred embodiment of the present invention, it will be appreciated by those of ordinary skill in the art that any conventional logic or electrical arrangements which are calculated to achieve the same purpose may be substituted for the specific configurations shown. For example, although CML or ECL design structures are generally preferred due to their wide spread use, the electrical configurations and the logic described may be implemented through the use of other design structures. By way of another example, it will be readily appreciated by those of ordinary skill in the art that although positive logic conventionals have been used, negative logic conventions may be alternatively substituted. As still another example, although specific logic components and associated conditions necessary for the operation of the present system have been mentioned in order to describe preferred embodiments of the present invention, complementary logic configurations similar to those mentioned may alternatively be employed, such as the substitution of NAND-type logic for NOR-type logic, without any deviation from the concepts of the invention disclosed.

Thus, while the present invention have been described in connection with preferred embodiments thereof, it will be understood that many modifications will be readily apparent to those of ordinary skill in the art. Therefore, it is intended that this invention be limited only by the claims and the equivalents thereof.

What is claimed is:

1. A register bit-slice, comprising:
    (a) memory means for storing a bit, the memory means comprising an input for receiving a data signal; and
    (b) front-end logic means, comprising:
        (i) an output logically coupled to the input of the memory means;
        (ii) control input means for receiving one or more control input signals;
        (iii) first data input means for receiving a first data input signal;
        (iv) second data input means for receiving a second data input signal;
        (v) a current switch;
        (vi) means for operating in a first operational mode by logically coupling the first data input means to the input of the memory means while switching at most one current switch along a signal path from the first data input means to the input of the memory means;
        (vii) means for operating in a second operational mode by logically coupling the second data input means to the input of the memory means;
        (viii) means for operating in a third operational mode by providing to the input of the memory means a logical function generated from the input signals received from the first and second data input means; and
        (ix) means for selectively configuring to one of the operational modes based on the one or more control input signals.

2. The register bit-slice of claim 1 wherein the memory means comprises a bi-stable multi-vibrator.

3. The register bit-slice of claim 1 comprising emitter-coupled-logic (ECL) design structures.

4. The register bit-slice of claim 1 comprising current-mode-logic (CML) design structures.

5. The register bit-slice of claim 1 wherein the means for operating in a third operational mode comprises means for providing to the input of the memory means an XOR logical function generated from the input signals received from the first and second data input means.

6. The register bit-slice of claim 1 wherein the control input means comprises a first control input means for receiving a first control input signal and a second control input means for receiving a second control input signal.

7. A register bit-slice, comprising:
    (a) memory means for storing a bit, the memory means comprising an input for receiving a data signal;
    (b) front-end logic means, comprising:
        (i) an output for providing an output signal;

(ii) control input means for receiving one or more control input signals;

(iii) first data input means for receiving a first data input signal;

(iv) second data input means for receiving a second data input signal;

(v) a current switch;

(vi) means for operating in a first operational mode by logically coupling the first data input means to the output of the front-end logic means while switching at most one current switch along a signal path from the first data input means to the input of the memory means;

(vii) means for operating in a second operational mode by logically coupling the second data input means to the output of the front-end logic means; and (viii) means for operating in a third operational mode by providing to the output of the frontend logic means a logical function generated from the input signals received from the first and second data input means; and (ix) means for selectively configuring to one of the operational modes based on the one or more control input signals; and (c) logic level adjust means for adjusting the output signal provided by the output of the front-end logic means to a level acceptable to the input of the memory means, the logic level adjust means comprising an input for providing a logical coupling to the output of the front-end logic means and an output for providing a logical coupling to the input of the memory means.

8. The register bit-slice of claim 7 wherein the memory means comprises a bi-stable multi-vibrator.

9. The register bit-slice of claim 7 comprising emitter-coupled-logic (ECL) design structures.

10. The register bit-slice of claim 7 comprising current-mode-logic (CML) design structures.

11. The register bit-slice of claim 7 wherein the means for operating in a third operational mode comprises means for providing to the output of the front-end logic means an XOR logical function generated from the input signals received from the first and second data input means.

12. The register bit-slice of claim 7 wherein the control input means comprises a first control input means for receiving a first control input signal and a second control input means for receiving a second control input signal.

13. A register bit-slice, comprising:

(a) memory means for storing a bit, the memory means comprising an input for receiving a data signal;

(b) front-end logic means, comprising:
  (i) an output for providing an output signal;
  (ii) first control input means for receiving a first control input signal;
  (iii) second control input means for receiving a second control input signal;
  (iv) first data input means for receiving a first data input signal;
  (v) second data input means for receiving a second data input signal;
  (vi) a current switch;
  (vii) means for operating in a first operational mode by logically coupling the first data input means to the output of the front-end logic means while switching at most one current switch along a signal path from the first data input means to the input of the memory means when the first control input signal comprises a "true" signal and the second control input signal comprises a "false" signal;
  (viii) means for operating in a second operational mode by logically coupling the second data input means to the output of the front-end logic means when the first control input signal comprises a "false" signal and the second control input signal comprises a "true" signal;
  (ix) means for operating in a third operational mode by providing to the output of the front-end logic means an XOR logical function generated from the input signals received from the first and second data input means when the first control input signal comprises a "false" signal and the second control input signal comprises a "false" signal; and
  (x) means for operating in a fourth operational mode logically coupling a "true" signal to the output of the front-end logic means when the first control input signal comprises a "true" signal and the second control input signal comprises a "true" signal; and (c) logic level adjust means for adjusting the output signal provided by the output of the front-end logic means to a level acceptable to the input of the memory means, the logic level adjust means comprising an input for providing a logical coupling to the output of the front-end logic means and an output for providing a logical coupling to the input of the memory means.

14. The register bit-slice of claim 13 wherein the memory means comprises a bi-stable multi-vibrator.

15. The register bit-slice of claim 13 comprising emitter-coupled-logic (ECL) design structures.

16. The register bit-slice of claim 13 comprising current-mode-logic (CML) design structures.

* * * * *